US008153282B2

(12) United States Patent
Mellott et al.

(10) Patent No.: US 8,153,282 B2
(45) Date of Patent: Apr. 10, 2012

(54) SOLAR CELL WITH ANTIREFLECTIVE COATING WITH GRADED LAYER INCLUDING MIXTURE OF TITANIUM OXIDE AND SILICON OXIDE

(75) Inventors: Nathan P. Mellott, Northville, MI (US); Thomas J. Taylor, Northville, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 416 days.

(21) Appl. No.: 11/284,424

(22) Filed: Nov. 22, 2005

(65) Prior Publication Data
US 2007/0116966 A1  May 24, 2007

(51) Int. Cl.
*B32B 9/00* (2006.01)
*B32B 9/04* (2006.01)
*B32B 19/00* (2006.01)
*B32B 19/04* (2006.01)
*B32B 17/06* (2006.01)
*B32B 27/32* (2006.01)

(52) U.S. Cl. ........ 428/701; 428/213; 428/220; 428/426; 428/432; 428/446; 428/448; 428/699

(58) Field of Classification Search .................. 65/60.2; 428/212, 216, 213, 220, 426, 432, 446, 448, 428/699, 701
See application file for complete search history.

(56) References Cited

U.S. PATENT DOCUMENTS

| 4,510,344 A | 4/1985 | Berman |
| 4,792,536 A | 12/1988 | Pecoraro et al. |
| 4,806,436 A | 2/1989 | Tada et al. |
| 4,816,333 A | 3/1989 | Lange et al. |
| 4,830,879 A | 5/1989 | Debsikdar |
| 5,214,008 A | 5/1993 | Beckwith et al. |
| 5,234,748 A | 8/1993 | Demiryont et al. |
| 5,356,718 A * | 10/1994 | Athey et al. ............ 428/428 |
| 5,401,287 A | 3/1995 | Pecoraro et al. |
| 5,883,030 A | 3/1999 | Bako et al. |
| 5,948,131 A | 9/1999 | Neuman |
| 5,964,962 A | 10/1999 | Sannomiya et al. |
| 5,977,477 A | 11/1999 | Shiozaki |
| 6,165,598 A * | 12/2000 | Nelson ..................... 428/212 |
| 6,174,599 B1 * | 1/2001 | Boire et al. .............. 428/336 |
| 6,372,327 B1 | 4/2002 | Burnham et al. |
| 6,387,515 B1 | 5/2002 | Joret et al. |
| 6,403,509 B2 | 6/2002 | Cochran et al. |

(Continued)

FOREIGN PATENT DOCUMENTS

EP   1 329 433   7/2003

(Continued)

OTHER PUBLICATIONS

U.S. Appl. No. 11/122,218, filed May 5, 2005.

(Continued)

*Primary Examiner* — Jonathan Langman
(74) *Attorney, Agent, or Firm* — Nixon & Vanderhye P.C.

(57) ABSTRACT

There is provided a coated article (e.g., solar cell) that includes an improved anti-reflection (AR) coating. This AR coating functions to reduce reflection of light from a glass substrate, thereby allowing more light within the solar spectrum to pass through the incident glass substrate. In certain example embodiments, the AR coating includes a graded base layer having a varying refractive index value, and an overcoat layer which may be provided for destructive interference purposes.

12 Claims, 2 Drawing Sheets

U.S. PATENT DOCUMENTS

| | | |
|---|---|---|
| 6,407,021 B1 | 6/2002 | Kitayama et al. |
| 6,495,482 B1 | 12/2002 | de Sandro et al. |
| 6,498,118 B1 | 12/2002 | Landa et al. |
| 6,503,860 B1 | 1/2003 | Dickinson et al. |
| 6,506,622 B1 | 1/2003 | Shiozaki |
| 6,521,558 B2 | 2/2003 | Landa et al. |
| 6,573,207 B2 | 6/2003 | Landa et al. |
| 6,576,349 B2 | 6/2003 | Lingle et al. |
| 6,585,871 B1 | 7/2003 | Anzaki et al. |
| 6,610,622 B1 | 8/2003 | Landa et al. |
| 6,716,780 B2 | 4/2004 | Landa et al. |
| 6,723,211 B2 | 4/2004 | Lingle et al. |
| 6,749,941 B2 | 6/2004 | Lingle |
| 6,776,007 B2 | 8/2004 | Hirota et al. |
| 6,787,005 B2 | 9/2004 | Laird et al. |
| 6,796,146 B2 | 9/2004 | Burnham |
| 6,846,760 B2 | 1/2005 | Siebers et al. |
| 6,887,575 B2 | 5/2005 | Neuman et al. |
| 2002/0090519 A1 | 7/2002 | Kursawe et al. |
| 2004/0028918 A1 | 2/2004 | Becker et al. |
| 2004/0058079 A1 | 3/2004 | Yamada et al. |
| 2004/0121896 A1 | 6/2004 | Landa et al. |
| 2004/0209757 A1 | 10/2004 | Landa et al. |
| 2004/0248995 A1 | 12/2004 | Glaubitt et al. |
| 2004/0258929 A1 | 12/2004 | Glaubitt et al. |
| 2005/0137084 A1* | 6/2005 | Krisko et al. ............... 502/349 |
| 2005/0195486 A1 | 9/2005 | Sasaki et al. |

FOREIGN PATENT DOCUMENTS

| | | |
|---|---|---|
| JP | 07-122764 | 5/1995 |
| JP | 11-60269 | 3/1999 |

OTHER PUBLICATIONS

U.S. Appl. No. 11/049,292, filed Feb. 3, 2005.

"Colored Glasses" Weyl; The Society of Glass Technology 1951, (4pgs).

"Colour Generation and Control in Glass", Bamford, Glass Science and Technology, 2, 1977 (3pgs).

"Photovoltaic Module Performance and Durability Following Long-Term Field Exposure", King et al., Sandia National Laboratories, (19pgs).

"Antireflection of Glazings for Solar Energy Applications", Nostell et al., Solar Energy Materials and Solar Cells 54 (1988) pp. 223-233.

"Anti-reflection (AR) Coatings Made by Sol-Gel Process: A Review", Chen, Solar Energy Materials and Solar Cells 68 (2001) pp. 313-336.

"Silica Antireflective Films on Glass Produced by the Sol-Gel Method", Bautista et al., Solar Energy Materials and Solar Cells 80 (2003) pp. 217-225.

International Search Report dated Mar. 28, 2007.

* cited by examiner

SOLAR CELL WITH ANTIREFLECTIVE COATING WITH GRADED LAYER INCLUDING MIXTURE OF TITANIUM OXIDE AND SILICON OXIDE

This invention relates to a coated article that includes an antireflective (AR) coating supported by a glass substrate such as a glass superstrate or other type of substrate. The AR coating includes a graded layer including a mixture of a titanium oxide and a silicon oxide in certain example embodiments. In certain example embodiments, the coated article may be a solar cell, but this invention is applicable to other types of coated articles as well.

BACKGROUND OF THE INVENTION

Glass is desirable for numerous properties and applications, including optical clarity and overall visual appearance. For some example applications certain optical properties (e.g., light transmission, reflection and/or absorption) are desired to be optimized. For example, in certain example instances reduction of light reflection from the surface of a glass substrate (e.g., superstrate or any other type of glass substrate) is desirable for storefront windows, display cases, solar cells, picture frames, other types of windows, and so forth.

Solar cells/modules are known in the art. Glass is an integral part of most common commercial photovoltaic modules (e.g., solar cells), including both crystalline and thin film types. A solar cell/module may include, for example, a photoelectric transfer film made up of one or more layers located between a pair of substrates. One or more of the substrates may be of glass. The glass may form a superstrate, protecting underlying device(s) and/or layer(s) for converting solar energy to electricity. Example solar cells are disclosed in U.S. Pat. Nos. 4,510,344, 4,806,436, 6,506,622, 5,977,477, and JP 07-122764, the disclosures of which are hereby incorporated herein by reference.

Substrate(s) in a solar cell/module are sometimes made of glass. Incoming radiation passes through the incident glass substrate of the solar cell before reaching the active layers (e.g., photoelectric transfer film such as a semiconductor) of the solar cell. Radiation that is reflected by the incident glass substrate does not make its way into the active layer(s) of the solar cell thereby resulting in a less efficient solar cell. In other words, it would be desirable to decrease the amount of radiation that is reflected by the incident substrate, thereby increasing the amount of radiation that makes its way to the active layer(s) of the solar cell. In particular, the power output of a solar cell or photovoltaic module is dependant upon the amount of light, or number of photons, within a specific range of the solar spectrum that pass through the incident glass substrate and reach the photovoltaic semiconductor.

Thus, it will be appreciated that there exists a need for an improved AR coating, for solar cells or other applications, to reduce reflection off of glass substrates.

BRIEF SUMMARY OF EXAMPLE EMBODIMENTS OF THE INVENTION

In certain example embodiments of this invention, an improved anti-reflection (AR) coating is provided on an incident glass substrate of a solar cell or the like. This AR coating functions to reduce reflection of light from the glass substrate, thereby allowing more light within the solar spectrum to pass through the incident glass substrate and reach the photovoltaic semiconductor so that the solar cell can be more efficient.

In other example embodiments of this invention, such an AR coating is used in applications other than solar cells, such as in storefront windows, display cases, picture frames, other types of windows, and the like.

In certain example embodiments, the AR coating includes a graded layer that includes a mixture of titanium oxide (e.g., $TiO_2$ or other suitable stoichiometry) and silicon oxide (e.g., $SiO_2$ or other suitable stoichiometry). In certain example embodiments, the graded layer includes a greater amount of silicon oxide at the side of the graded layer closest to the glass substrate than at a side of the graded layer further from the glass substrate. Moreover, in certain example embodiments, the graded layer includes a greater amount of titanium oxide at a side of the graded layer further from the glass substrate than at a side of the graded layer closer to the glass substrate. An additional type of coating such as silicon oxide or the like may be provided over the graded layer in certain example embodiments. Thus, it is possible to provide an AR coating on a glass substrate using a combination of both graded refractive index and destructive interference approaches.

In certain example embodiments, where the graded layer, having a graded or varying refractive index (n), is deposited (e.g., via sputtering or the like) on the glass (directly or indirectly) where the composition profile varies from predominately $SiO_2$ near the glass surface to a higher index material predominately $TiO_2$ further from the glass surface, one can effectively change the refractive index (n) of the "glass" surface to about 2.3-2.5. Then, a layer of $SiO_2$ at about a ¼ wave thickness (from about 100 nm) deposited on top of the $SiO_2/TiO_2$ graded layer will act as a destructive interference coating and hence be antireflective. The layer of $SiO_2$ has a physical thickness of from about 80 to 140 nm, more preferably from about 110 to 130 nm, and most preferably about 125 nm in certain example embodiments so as to represent a ¼ wave thickness.

In certain example embodiments, there is provided a solar cell comprising: photovoltaic layer and at least a glass substrate on a light incident side of the photovoltaic layer; an anti-reflection coating provided on the glass substrate, the anti-reflection coating being located on a light-incident side of the glass substrate; wherein the anti-reflection coating comprises a graded layer provided directly on and contacting the glass substrate, the graded layer including a mixture of silicon oxide and titanium oxide, with more titanium oxide being provided in a far portion of the graded layer farther from the glass substrate than in a near portion of the graded layer closer to the glass substrate; and wherein the anti-reflection coating further comprises a layer comprising silicon oxide located over the graded layer.

In certain example embodiments, there is provided a solar cell comprising: a photovoltaic layer and at least a glass substrate on a light incident side of the photovoltaic layer; an anti-reflection coating provided on the glass substrate, the anti-reflection coating being located on a light-incident side of the glass substrate; wherein the anti-reflection coating comprises a graded layer including a mixture of silicon oxide and a metal (M) oxide, with more metal (M) oxide being provided in a far portion of the graded layer farther from the glass substrate than in a near portion of the graded layer closer to the glass substrate, and wherein M is one or more of the group of Ti, Zr and Al; and wherein the anti-reflection coating further comprises a layer comprising silicon oxide located over the graded layer.

In still further example embodiments of this invention, there is provided a coated article comprising: a glass substrate and an anti-reflection coating on the glass substrate; wherein the anti-reflection coating comprises a graded layer including a mixture of silicon oxide and titanium oxide, with more titanium oxide being provided in a far portion of the graded layer farther from the glass substrate than in a near portion of the graded layer closer to the glass substrate; and wherein the anti-reflection coating further comprises a layer comprising silicon oxide located over the graded layer.

DETAILED DESCRIPTION OF EXAMPLE EMBODIMENTS OF THE INVENTION

Figure 1:
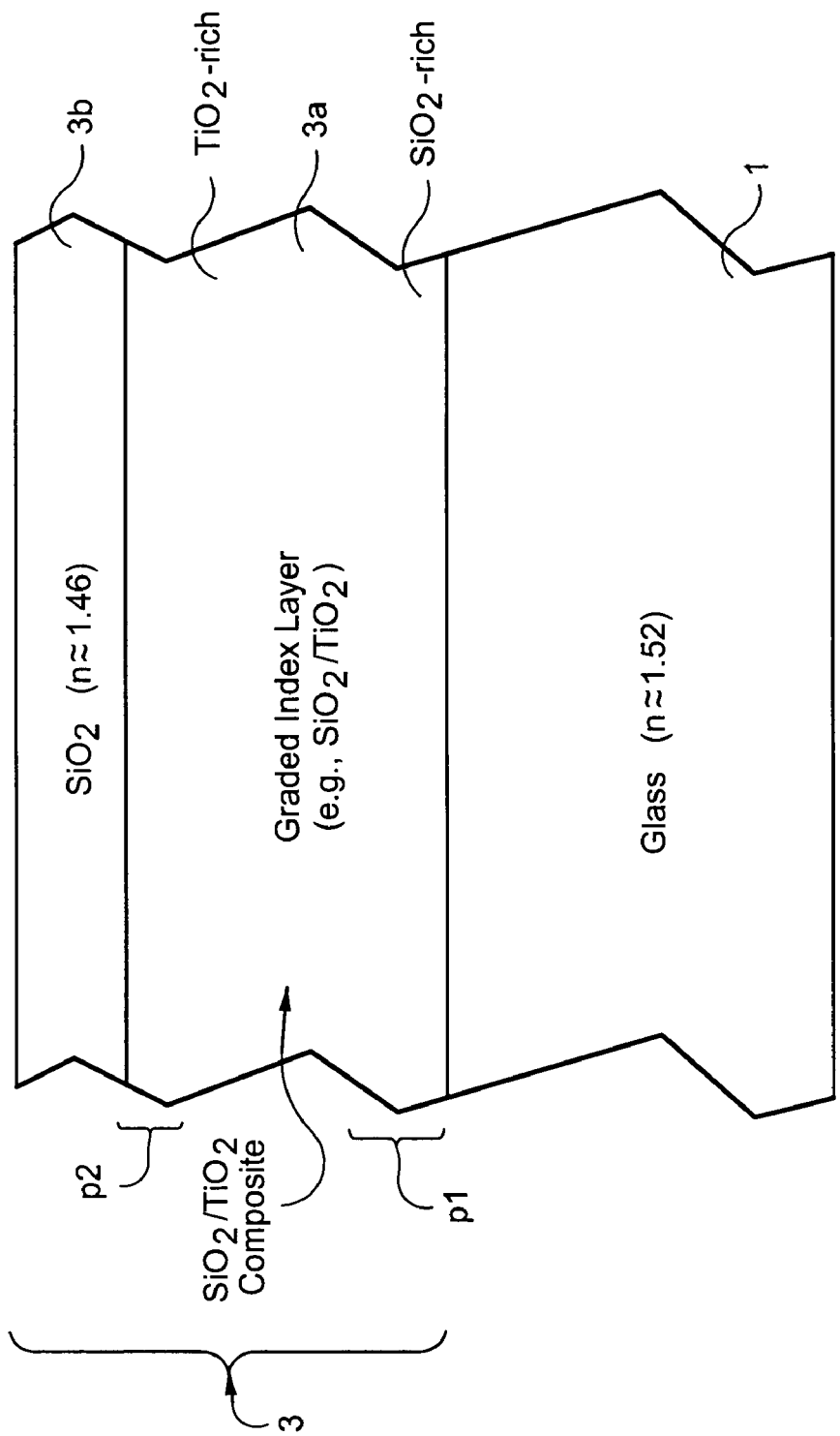
FIG. 1 is a cross sectional view of a coated article including an antireflective (AR) coating according to an example embodiment of this invention.

Referring now more particularly to the accompanying drawings in which like reference numerals indicate like parts throughout the several views.

This invention relates to antireflective (AR) coatings that may be provided for coated articles such as solar cells, storefront windows, display cases, picture frames, other types of windows, and the like.

In certain example embodiments of this invention, an improved anti-reflection (AR) coating is provided on an incident glass substrate of a solar cell or the like. This AR coating functions to reduce reflection of light from the glass substrate, thereby allowing more light within the solar spectrum to pass through the incident glass substrate and reach the photovoltaic semiconductor so that the solar cell can be more efficient. In other example embodiments of this invention, such an AR coating is used in applications other than solar cells, such as in storefront windows, display cases, picture frames, other types of windows, and the like. The glass substrate may be a glass superstrate or any other type of glass substrate in different instances.

FIG. 1 is a cross sectional view of a coated article according to an example embodiment of this invention. The coated article of FIG. 1 includes a glass substrate 1 and an AR coating 3. The AR coating includes a graded layer 3a and an overcoat layer 3b. The graded layer 3a may be graded with respect to its material and/or refractive index (n) value.

In the FIG. 1 embodiment, the graded layer 3a includes a mixture of a titanium oxide (e.g., $TiO_2$ or other suitable stoichiometry, such as $TiO_x$ where x is from 1.0 to 2.0) and silicon oxide (e.g., $SiO_2$ or other suitable stoichiometry, such as $SiO_x$ where x is from 1.0 to 2.0). In certain example embodiments, the graded layer 3a includes a greater amount of a silicon oxide at a side of the graded layer 3a closest to the glass substrate 1 than at a side of the graded layer 3a further from the glass substrate 1. Moreover, in certain example embodiments, the graded layer 3a includes a greater amount of titanium oxide at a side of the graded layer 3a further from the glass substrate 1 than at a side of the graded layer 3a closer to the glass substrate 1.

In certain example embodiments of this invention, the portion p1 of the graded layer 3a closest to the glass substrate 1 is predominately made up of silicon oxide (e.g., $SiO_2$), and the portion p2 of the graded layer 3a furthest from the glass substrate 1 is predominately made up of titanium oxide (e.g., $TiO_2$). In certain example embodiments of this invention, the portion p1 of the graded layer 3a closest to the glass substrate 1 is from about 40-100% silicon oxide (e.g., $SiO_2$), more preferably from about 50-100%, even more preferably from about 70-100% and most preferably from about 80-100% silicon oxide (with the remainder being made up of titanium oxide or some other material). In certain example embodiments of this invention, the portion p2 of the graded layer 3a furthest from the glass substrate 1 is from about 40-100% titanium oxide (e.g., $TiO_2$), more preferably from about 50-100%, even more preferably from about 70-100% and most preferably from about 80-100% titanium oxide (with the remainder being made up of silicon oxide or some other material). In certain example embodiments of this invention, the portions p1 and p2 of the graded layer 3a may contact each other near the center of the layer, whereas in other example embodiments of this invention the portions p1 and p2 of the graded layer 3a may be spaced apart from each other via an intermediately portion of the graded layer 3a that is provided at the central portion of the graded layer as shown in FIG. 1.

In certain example embodiments of this invention, the refractive index (n) value of the graded layer 3a varies throughout its thickness, with the refractive index (n) being less at the portion of layer 3a closest to the glass substrate 1 and greater at the portion of the layer 3a furthest from the glass substrate 1. In certain example embodiments of this invention, the refractive index value of the near portion p1 of the graded layer 3a closest to the glass substrate may be from about 1.46 to 1.9, more preferably from about 1.46 to 1.8, even more preferably from about 1.46 to 1.7, and possibly from about 1.46 to 1.6. The near portion p1 of the layer 3a may be from about 5 to 10,000 Å thick, possibly from about 10 to 500 Å thick, in certain example embodiments of this invention. In certain example embodiments of this invention, the refractive index value of the far portion p2 of the graded layer 3a farthest from the glass substrate 1 may be from about 1.8 to 2.55, more preferably from about 1.9 to 2.55, even more preferably from about 2.0 to 2.55, and possibly from about 2.3 to 2.55. The far portion p2 of the layer 3a may be from about 5 to 10,000 Å thick, possibly from about 10 to 500 Å thick, in certain example embodiments of this invention. It has been found that the use of titanium (Ti) oxide in the graded layer 3a is particularly advantageous in that it permits a high refractive index value to be possible in the outer portion p2 of the graded layer 3a, thereby improving antireflective properties of the AR coating.

The graded layer 3a may be deposited on the glass substrate 1 in any suitable manner. For example, the graded layer 3a may be deposited by sputtering in certain example embodiments. In certain example instances, the layer may be sputter-deposited by initially sputter-depositing several layers in a sequence with varying ratios of silicon oxide to titanium oxide; then the resulting sequence of layers could be heat treated (e.g., 250 to 900 degrees C.). To deposit this sequence of layers initially, targets of Si, SiAl, Ti, and/or SiTi could be used. For example, a Si or SiAl sputtering target(s) in an oxygen and argon gaseous atmosphere could be used to sputter-depositing the bottom layer(s) of the sequence, a Ti sputtering target(s) in an oxygen and argon gaseous atmosphere could be used to sputter-deposit the top layer(s) of the sequence, and a Si/Ti target(s) in an oxygen and argon atmosphere could be used to sputter-deposit the intermediate layer(s) of the sequence. The diffusion profile or composition profile would be controlled by the heat treatment time and temperature that the sequence was subjected to so as to result in a graded layer 3a as discussed above. However, heat treatment need not be used. Other techniques for forming the graded layer 3a could instead be used.

The graded layer 3a may be any suitable thickness in certain example embodiments of this invention. However, in certain example embodiments, the graded layer 3a has a thickness of at least one wavelength of light. Moreover, the refractive index (n) value and/or material composition of the graded layer 3a may vary throughout the layer in either a continuous or non-continuous manner in different example embodiments of this invention.

The graded layer uses titanium oxide as a high index material in the FIG. 1 embodiment. However, it is noted that Zr may be used to replace or supplement the Ti in the FIG. 1 embodiment in certain alternative embodiments of this invention. In still further example embodiments, Al may be used to replace or supplement the Ti in the FIG. 1 embodiment in certain alternative embodiments of this invention.

An antireflective layer 3b of or including a material such as silicon oxide (e.g., $SiO_2$) or the like may be provided over the graded layer 3a in certain example embodiments of this invention as shown in FIG. 1 for example. In certain example embodiments, the thickness of the overcoat antireflective layer 3b is approximately a ¼ wave thickness (quarter wave thickness plus/minus about 5 or 10%) so as to act as a destructive interference coating/layer thereby reducing reflection from the interface between layers 3a and 3b. When the quarter wave thickness layer 3b is composed of $SiO_2$ at about a ¼ wave thickness, then the layer 3b will have a physical thickness of from about 80 to 140 nm, more preferably from about 120 to 130 nm, and most preferably about 125 nm in certain example embodiments so as to represent a ¼ wave thickness. While silicon oxide is preferred for destructive interference layer 3b in certain example embodiments, it is possible to use other materials for this layer 3b in other example embodiments of this invention. When other materials are used for layer 3b, the layer 3b may also have an approximate quarter wave thickness in certain example embodiments of this invention. Silicon oxide inclusive layer 3b may be relatively dense in certain example embodiments of this invention; e.g., from about 75-100% hardness, for protective purposes. It is noted that it is possible to form other layer(s) over layer 3b in certain example instances, although in many embodiments the layer 3b is the outermost layer of the AR coating 3.

The layer 3b could be deposited over layer 3a in any suitable manner. For example, a Si or SiAl target could be sputtered in an oxygen and argon atmosphere to sputter-deposit the silicon oxide inclusive layer 3b. Alternatively, the silicon oxide inclusive layer 3b could be deposited by flame pyrolysis, or any other suitable technique such as spraying, roll coating, printing, via silica precursor sol-gel solution (then drying and curing), coating with a silica dispersion of nano or colloidal particles, vapor phase deposition, and so forth.

It is noted that silicon oxide of layer 3a and/or 3b may be doped with other materials such as aluminum, nitrogen or the like. Likewise, the titanium oxide of layer 3a may be doped with other material(s) as well in certain example instances.

Because of the use of the approximate quarter wave thickness of layer 3b, it is possible to provide an AR coating 3 on the glass substrate 1 using a combination of a graded refractive index (due to layer 3a) and destructive interference (due to layer 3b) approaches. The graded index approach allows reflections to be reduced at the interface between the glass substrate 1 and the graded layer 3a, whereas the destructive interference allows reflections to be reduced at the interface between layers 3a and 3b. It has been found that this may increase the power output of a solar cell from about 1.0 to 4.0%, more preferably from about 1.3 to 2.5%, in certain example embodiments of this invention.

In certain example embodiments of this invention, high transmission low-iron glass may be used for glass substrate 1 in order to further increase the transmission of radiation (e.g., photons) to the active layer of the solar cell or the like. For example and without limitation, the glass substrate 1 may be of any of the glasses described in any of U.S. patent application Ser. Nos. 11/049,292 and/or 11/122,218, the disclosures of which are hereby incorporated herein by reference.

Certain glasses for glass substrate 1 (which or may not be patterned in different instances) according to example embodiments of this invention utilize soda-lime-silica flat glass as their base composition/glass. In addition to base composition/glass, a colorant portion may be provided in order to achieve a glass that is fairly clear in color and/or has a high visible transmission. An exemplary soda-lime-silica base glass according to certain embodiments of this invention, on a weight percentage basis, includes the following basic ingredients:

| EXAMPLE BASE GLASS | |
|---|---|
| Ingredient | Wt. % |
| $SiO_2$ | 67-75% |
| $Na_2O$ | 10-20% |
| CaO | 5-15% |
| MgO | 0-7% |
| $Al_2O_3$ | 0-5% |
| $K_2O$ | 0-5% |
| $Li_2O$ | 0-1.5% |
| BaO | 0-1% |

Other minor ingredients, including various conventional refining aids, such as $SO_3$, carbon, and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO.

In addition to the base glass above, in making glass according to certain example embodiments of the instant invention the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., cerium, erbium and/or the like). In certain example embodiments of this invention, the resulting glass has visible transmission of at least 75%, more preferably at least 80%, even more preferably of at least 85%, and most preferably of at least about 90% (sometimes at least 91%) (Lt D65). In certain example non-limiting instances, such high transmissions may be achieved at a reference glass thickness of about 3 to 4 mm In certain embodiments of this invention, in addition to the base glass, the glass and/or glass batch comprises or consists essentially of materials as set forth in Table 2 below (in terms of weight percentage of the total glass composition):

EXAMPLE ADDITIONAL MATERIALS IN GLASS

| Ingredient | General (Wt. %) | More Preferred | Most Preferred |
|---|---|---|---|
| total iron (expressed as $Fe_2O_3$): | 0.001-0.06% | 0.005-0.04% | 0.01-0.03% |
| cerium oxide: | 0-0.30% | 0.01-0.12% | 0.01-0.07% |
| $TiO_2$ | 0-1.0% | 0.005-0.1% | 0.01-0.04% |
| Erbium oxide: | 0.05 to 0.5% | 0.1 to 0.5% | 0.1 to 0.35% |

In certain example embodiments, the total iron content of the glass is more preferably from 0.01 to 0.06%, more preferably from 0.01 to 0.04%, and most preferably from 0.01 to 0.03%. In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material. It is noted that while the presence of cerium oxide is preferred in many embodiments of this invention, it is not required in all embodiments and indeed is intentionally omitted in many instances. However, in certain example embodiments of this invention, small amounts of erbium oxide may be added to the glass in the colorant portion (e.g., from about 0.1 to 0.5% erbium oxide).

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

It is noted that the light-incident surface of the glass substrate 1 may be flat or patterned in different example embodiments of this invention.

Figure 2:
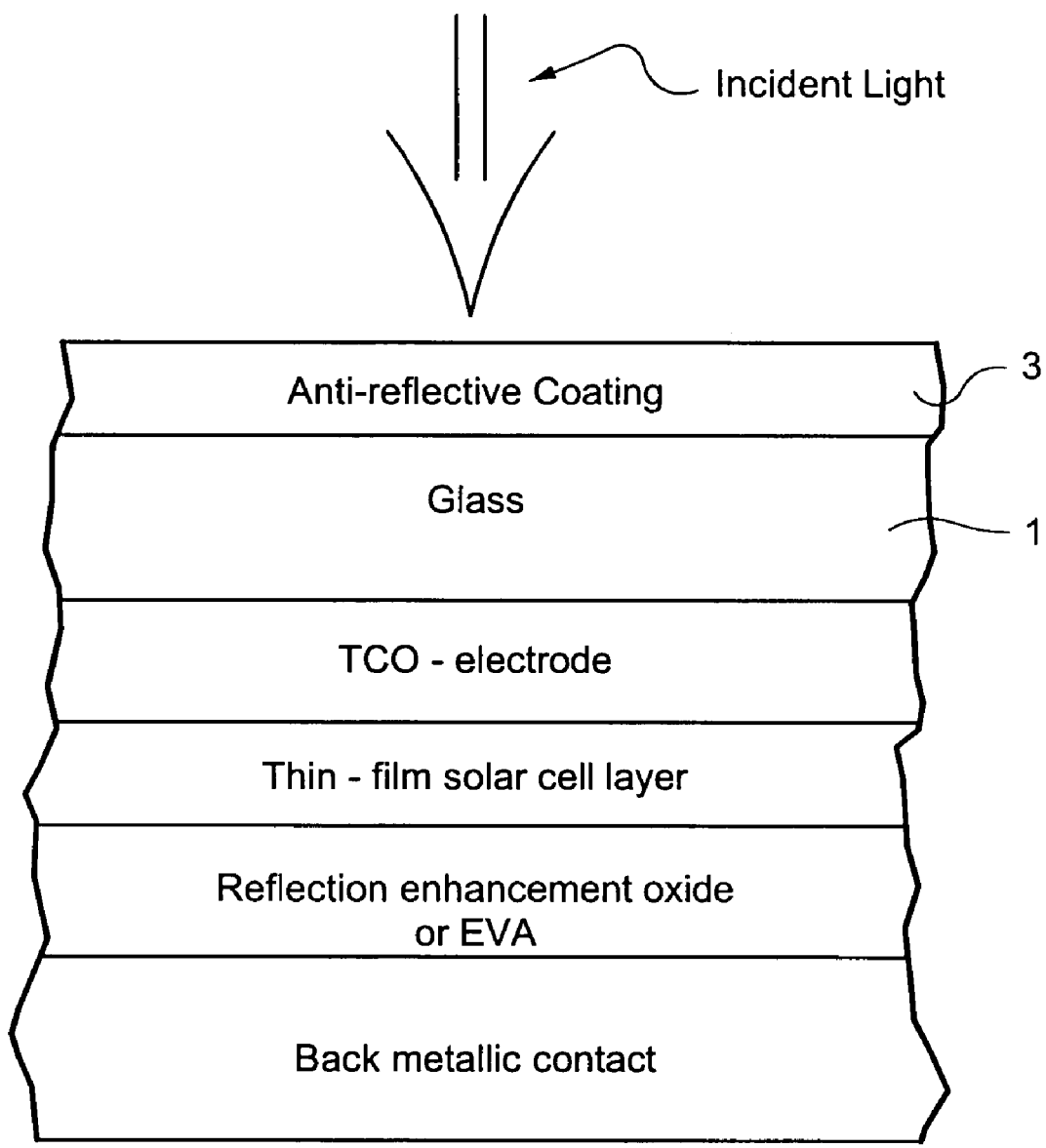
FIG. 2 is a cross sectional view of a solar cell that may use the AR coating of FIG. 1 according to an example embodiment of this invention.

FIG. 2 is a cross-sectional view of a solar cell or photovoltaic device, for converting light to electricity, according to an example embodiment of this invention. The solar cell of FIG. 2 uses the AR coating 3 and glass substrate 1 shown in FIG. 1 in certain example embodiments of this invention. The incoming or incident light is first incident on layer 3b of the AR coating 3, passes therethrough and then through layer 3a and through glass substrate 1 before reaching the photovoltaic semiconductor of the solar cell (see the thin film solar cell layer in FIG. 2). Note that the solar cell may also include, but does not require, an electrode such as a transparent conductive oxide (TCO), a reflection enhancement oxide or EVA film, and/or a back metallic contact as shown in example FIG. 2. Other types of solar cells may of course be used, and the FIG. 2 solar cell is merely provided for purposes of example and understanding. As explained above, the AR coating 3 reduces reflections of the incident light and permits more light to reach the thin film semiconductor layer of the solar cell thereby permitting the solar cell to act more efficiently.

While certain of the AR coatings 3 discussed above are used in the context of the solar cells/modules, this invention is not so limited. AR coatings according to this invention may be used in other applications such as for picture frames, fireplace doors, and the like. Also, other layer(s) may be provided on the glass substrate under the AR coating so that the AR coating is considered on the glass substrate even if other layers are provided therebetween. Also, while the graded layer 3a is directly on and contacting the glass substrate 1 in the FIG. 1 embodiment, it is possible to provide other layer(s) between the glass substrate and the graded layer in alternative embodiments of this invention.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A photovoltaic device comprising:
a photovoltaic layer and at least a glass substrate on a light incident side of the photovoltaic layer;
an anti-reflection coating provided on the glass substrate, the anti-reflection coating being located on a light-incident side of the glass substrate;
wherein the anti-reflection coating consists essentially of a graded layer provided directly on and contacting the glass substrate and a layer comprising silicon oxide over and contacting the graded layer, the graded layer including a mixture of silicon oxide, and titanium oxide supplemented with zirconium oxide, with more titanium oxide and zirconium oxide being provided in a far portion of the graded layer farther from the glass substrate than in a near portion of the graded layer closer to the glass substrate, and wherein the graded layer has a thickness of at least one wavelength; and
wherein the layer comprising silicon oxide has about a quarter-wavelength thickness and is located on and directly contacting the graded layer.

2. The photovoltaic device of claim 1, wherein the near portion of the graded layer has a refractive index value less than that of the far portion of the graded layer.

3. The photovoltaic device of claim 1, where the near portion of the graded layer is made up of predominately silicon oxide.

4. The photovoltaic device of claim 1, wherein the near portion of the graded layer has a refractive index value of from about 1.46 to 1.9.

5. The photovoltaic device of claim 1, wherein the near portion of the graded layer has a refractive index value of from about 1.46 to 1.7, wherein the titanium oxide is $TiO_2$ and the silicon oxide is $SiO_2$.

6. The photovoltaic device of claim 1, wherein the far portion of the graded layer has a refractive index value of from about 2.0 to 2.55.

7. The photovoltaic device of claim 1, wherein the far portion of the graded layer has a refractive index value of from about 2.3 to 2.55.

8. The photovoltaic device of claim 1, wherein the far portion of the graded layer is made up predominately of titanium oxide and zirconium oxide.

9. The photovoltaic device of claim 1, wherein the layer comprising silicon oxide, which is located on and contacting the graded layer, has a physical thickness of from about 80 to 140 nm thick.

10. The photovoltaic device of claim 1, wherein the near portion of the graded layer is made up of from about 40-100% silicon oxide and the far portion of the graded layer is made up of from about 50-100% titanium oxide and zirconium oxide.

11. The photovoltaic device of claim 1, wherein the near portion of the graded layer is made up of from about 70-100% silicon oxide and the far portion of the graded layer is made up of from about 70-100% titanium oxide and zirconium oxide.

12. The photovoltaic device of claim 1, wherein the glass substrate comprises:

| Ingredient | wt. % |
|---|---|
| $SiO_2$ | 67-75% |
| $Na_2O$ | 10-20% |
| CaO | 5-15% |
| total iron (expressed as $Fe_2O_3$) | 0.001 to 0.06% |
| cerium oxide | 0 to 0.30% | wherein the glass substrate by itself has a visible transmission of at least 90%, a transmissive a* color value of −1.0 to +1.0 and a transmissive b* color value of from 0 to +1.5.

* * * * *